(12) United States Patent
Wiegand

(10) Patent No.: US 6,377,967 B1
(45) Date of Patent: Apr. 23, 2002

(54) EFFICIENT DIGITAL INTEGRATION TECHNIQUE FILTER

(75) Inventor: Richard J. Wiegand, Millersville, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/132,964

(22) Filed: Aug. 12, 1998

(51) Int. Cl.[7] .............................................. G06F 17/10
(52) U.S. Cl. ...................................... 708/300; 375/295
(58) Field of Search .......................... 708/445, 300–301, 708/320, 322–323; 375/235, 261, 298, 295, 299

(56) References Cited

U.S. PATENT DOCUMENTS

| | | | | |
|---|---|---|---|---|
| 4,606,009 A | * | 8/1986 | Wiesmann | 708/445 |
| 5,068,818 A | * | 11/1991 | Uramoto et al. | 708/445 |
| 5,448,508 A | * | 9/1995 | Ono et al. | 708/445 |
| 5,568,507 A | * | 10/1996 | Hershey et al. | 375/299 |
| 5,677,932 A | * | 10/1997 | Comte et al. | 708/319 |
| 5,812,605 A | * | 9/1998 | Smith et al. | 375/295 |
| 6,081,822 A | * | 6/2000 | Hillery et al. | 708/445 |
| 6,091,780 A | * | 7/2000 | Sointula | 375/295 |
| 6,141,542 A | * | 10/2000 | Kotzin et al. | 375/299 |
| 6,173,014 B1 | * | 1/2001 | Forssen et al. | 375/299 |

* cited by examiner

Primary Examiner—Tan V. Mai

(57) ABSTRACT

An efficient digital integration technique (EDIT) filter uses a local oscillator pattern to provide the desired weighting for an input signal. A product waveform is determined by multiplying the local oscillator pattern and the input signal. The product waveform is then summed by a summing circuit with no additional multiplies. The output of the summing circuit is the filtered signal. Thus, a single multiply operation is required for the filter, thereby reducing costs.

25 Claims, 2 Drawing Sheets

EFFICIENT DIGITAL INTEGRATION TECHNIQUE FILTER

BACKGROUND OF THE INVENTION

1. Field of the Invention

The present invention is directed to a method and apparatus which provide a low cost digital filter that performs a continuous real time output programmable filter function.

2. Description of the Related Art

FIG. 1a shows a generic structure 10 for all filters. This structure 10 consists of a combination of delay elements 12, adders 14 and multipliers 16. The delay elements 12 are positioned between adders 14. In the generic structure shown, the multipliers 16 form both a feed forward path 18 and a feedback path 20 are illustrated.

In the feed forward path 18, the input signal is delivered to a plurality of multipliers 16, where the input signal is multiplied by a weight. The input signal is also delivered to a delay element 12, and then to the adder 14, which outputs the sum of the weighted signal and the delayed signal.

In the feedback path 20, the output signal is delivered to another plurality of multipliers 16, where the output signal is multiplied by a weight. The weighted output signal is then delivered to an adder 14, which outputs the sum of the weighted signal and the delayed signal.

One common type of digital filter which uses the generic structure shown in FIG. 1a is a finite-impulse-response (FIR) filter, shown in FIG. 1b.

The FIR filter only used the feed forward path 18 shown in FIG. 1a. The delay elements 12 are replaced with a digital tapped delay line 22. This results in a moving average which is non-recursive.

For typical electronic warfare (EW) applications, the FIR filter will be designed with 30 to 40 taps. The FIR filter is programmed, i.e., appropriately and individually adjusting the weights of these taps. This programming involves controlling the three key filter parameters, i.e., the center frequency, the bandwidth, and the shape factor.

Cost of a digital filter is linearly dependent on the number of multiplies required. Multiplying takes far more hardware than adding or delaying. A digital filter requires many multiplies to individually adjust the tap weights, although this can be reduced by half.

An infinite-impulse-response (IIR) filter uses weighted feedback paths, instead of the weighted feed forward paths of the FIR filter, to form a recursive difference filter. Using feedback requires fewer paths, typically called poles rather than taps, with a five pole filter being typical for EW applications. Thus, the IIR digital filter needs fewer multiplies.

However, the IIR filter also has a different phase response, which is undesirable for some applications. Further, the reduction in hardware is still not sufficient. For either of these filters, at either each tap or pole, the signal will be multiplied by a weighting coefficient, the sequence of which represent a desired filter response.

SUMMARY OF THE INVENTION

It is therefore an object of the present invention to provide a method and an apparatus for reducing internal operations, especially the number of multiplies, required by a digital filter. This reduction will result in a decreased cost of the digital filter.

These and other objects of the present invention will become more readily apparent from detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1A:
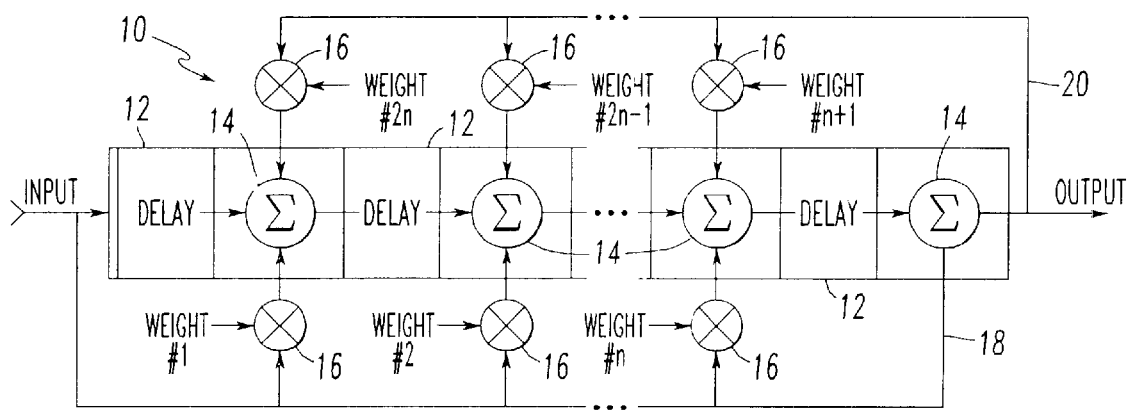
FIG. 1a illustrates a generic digital filter structure.
Figure 1B:
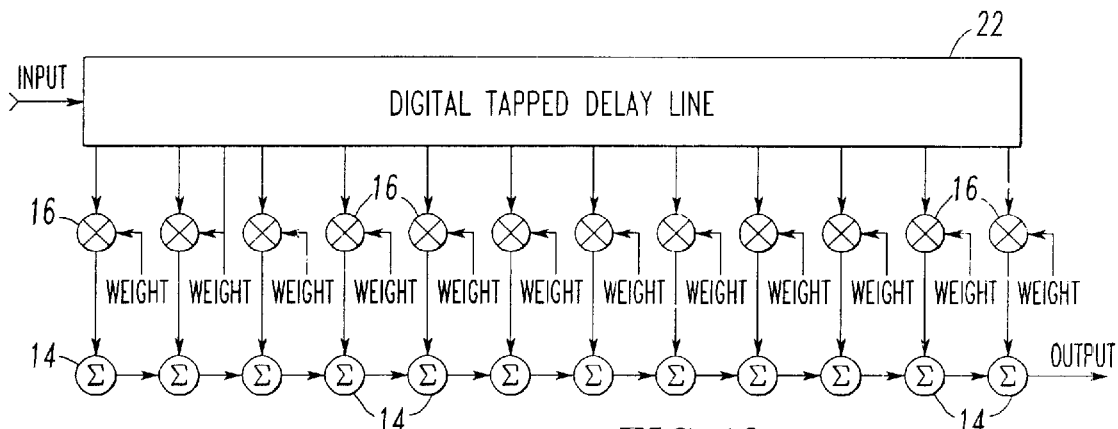
FIG. 1b is a conventional FIR digital filter.
Figure 2:
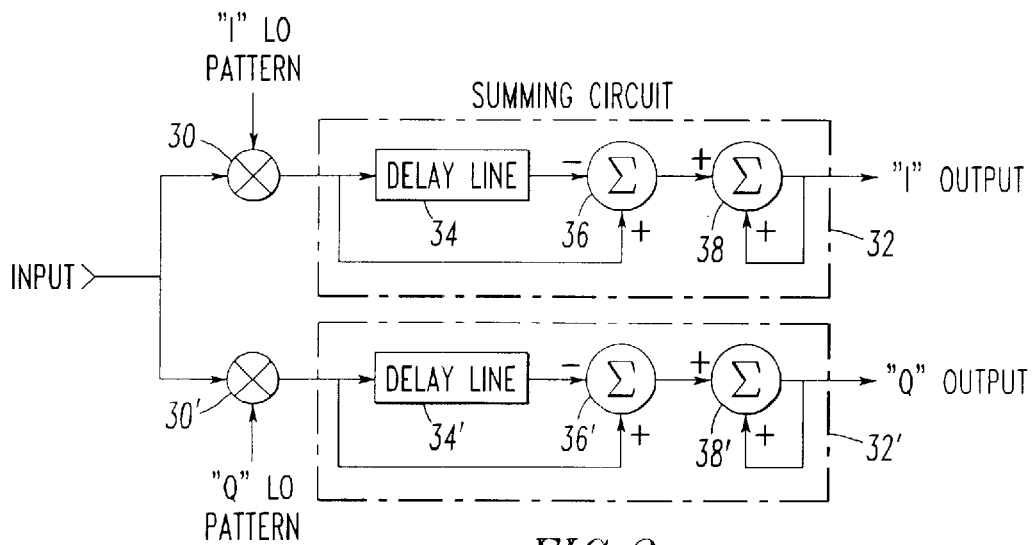
FIG. 2 is a digital filter according to the present invention.

An efficient digital integration technique (EDIT) filter of the present invention is shown in FIG. 2. The EDIT filter contains two basic portions, a multiply circuit 30 and a summing circuit 32.

The multiplication may be performed on a real signal with a single component output or as a complex signal with quadature-component outputs, as shown in FIG. 2. A complex signal is used for applications requiring phase information. For either type of signal, the multiply circuit 30 multiplies an input signal by a waveform that converts the original frequency band into a homodyne band. The resulting waveform is known as a local oscillator (LO) waveform.

This LO times input product output waveform is then supplied to the summing circuit 32. As shown in FIG. 2, this summing circuit 32 includes a delay line 34, a subtractor 36 and an adder 38. Operational details of the summing circuit 32, as well as alternative configurations thereof, are discussed below regarding FIGS. 3a–3c.

The local oscillator pattern supplied to the multiplier may be determined as follows when the input signals are continuous wave signals:

$$S_{ILO} = (A/N)\sum_{n=1}^{N-1} \cos(2\pi Ft - \pi Bt + \pi t(n-1/2)/D)$$

$$S_{QLO} = (A/N)\sum_{n=1}^{N-1} \sin(2\pi Ft - \pi Bt + \pi t(n-1/2)/D)$$

where

B is the desired bandwidth,

F is the desired central frequency,

N is the desired shape factor determinant,

A is the maximum amplitude allowed by the bits/ word resolution,

D is the length of the delay line 34
t is the time of the LO pattern,
$S_{ILO}$ is the LO pattern for the I channel,
$S_{QLO}$ is the LO pattern for the Q channel, and
n is a dummy counter.

The value of N is an integer which determines the shape factor, but is not equal to the shape factor. Typically, N is in the range between five and twenty, and N=1/ BD. When N is within this range, performance of the circuit of the present invention is equivalent to a 5 pole IIR filter or a 30 tap FIR filter. The value of N also determines the linearity of the filter's phase response. If the value of N is too small, then the filter skirts will be too shallow. If the value of N is too large, then more hardware is needed.

Thus, the selection of LO pattern determines the central frequency and the bandwidth of the filtered signal. If the architecture has a single component digital processing, then either $S_{ILO}$ or $S_{QLO}$ may be used. Effectively, the weighting required for averaging is thus determined before the EDIT filter is in use. The use of this a priori weighting allows the number of multiplies needed for the digital filter of the present invention to be reduced to one.

There are a number of manners in which the summing circuit 32 shown in FIG. 2 may be constructed. Since the weighting computation is contained in the LO pattern, the summing circuit 32 only needs to provide a recursive or a non-recursive summation. Three such satisfactory examples are discussed below.

Figure 3A:
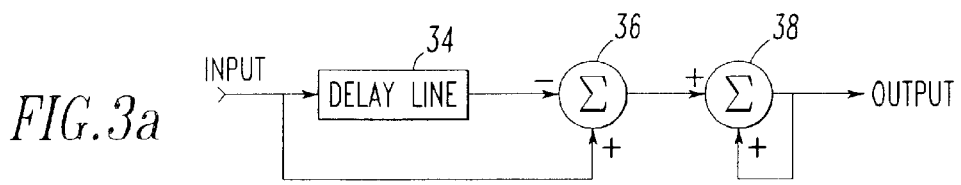
FIG. 3a is an embodiment of a summing circuit of the present invention.

As shown in FIG. 2 and FIG. 3a, the summing circuit 32 includes delay line 34, a subtractor 36, and an adder 38. The signal delivered to the summing circuit 32 is supplied to the delay line 34 and the subtractor 36. The subtractor also receives a delayed signal from the delay line 34 and subtracts the delayed signal from the signal input to the summing circuit 32. The adder 38 receives the fed back output of the summing circuit 32 and the difference output by the subtractor 36. The adder 38 adds the difference and the fed back output, and output the filtered signal. In a conventional filter, there would be a varying weight multiplier along the path delivering the LO waveform to the subtractor 36.

Figure 3B:
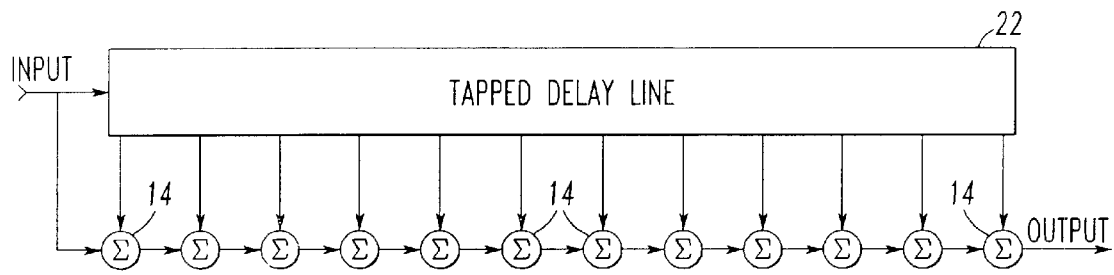
FIG. 3b is another embodiment of the summing circuit of the present invention.

FIG. 3b uses a tapped delay line 22 and an equal number of adders 14. Each adder 14 receives a delayed output from the tapped delay line 22 and a summed signal from the previous adder. The first adder receives the input waveform instead of a summed signal and the last adders sum is output as the filtered signal. In a conventional filter, there would be weighting multipliers between the tapped delay line 22 and the adders 14.

FIGS. 3a and 3b should function identically. They both continuously output a running total of the homodyne input waveform for the past number of units of time.

Figure 3C:
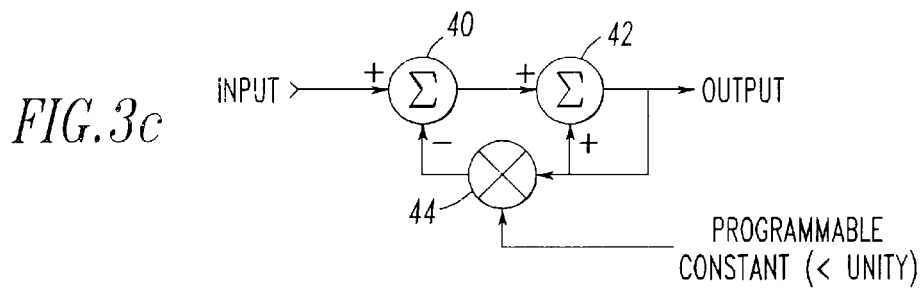
FIG. 3c is yet another embodiment of the summing circuit of the present invention.

FIG. 3c uses a subtractor 40, an adder 42 and a multiplier 44 that multiplies by a programmable constant weight which is much less than unity. It is expected that the programmable constant weight can be a power of two so the multiply function of the multiplier 44 can be achieved simply with some gates instead of a full multiply circuit. The output of the summing circuit in FIG. 3c is supplied to the adder 42 and to the multiplier 44. The multiplied signal from the multiplier 44 is output to the subtractor 40, where it is subtracted from the input signal. This difference is then supplied to the adder 42, where the difference is added to the output signal of the summing circuit also supplied thereto.

The filter characteristics of the EDIT filter shown in FIG. 2 are determined by the LO waveform characteristics and the amount of summing. The amount of summing is determined by the delay line length in FIGS. 3a and 3b, and by the programable FIG. 3c.

Specifically, the center frequency and the bandwidth of the EDIT filter shown in FIG. 2 are determined by the LO waveform. Thus, the programming of these parameters will be done via the LO waveform. If the programming of the shape factor is needed as well, this may be achieved by switching in different delays with gates in FIGS. 3a and 3b, and by changing the constant in FIG. 3c.

FIGS. 3a–3c all have an equivalent delay. The programmable constant weight of FIG. 3c is not equal to the delay, but is set so that the delay across the summing circuit is equivalent to the delays of the summing circuits of FIGS. 3a and 3b.

Figure 4:
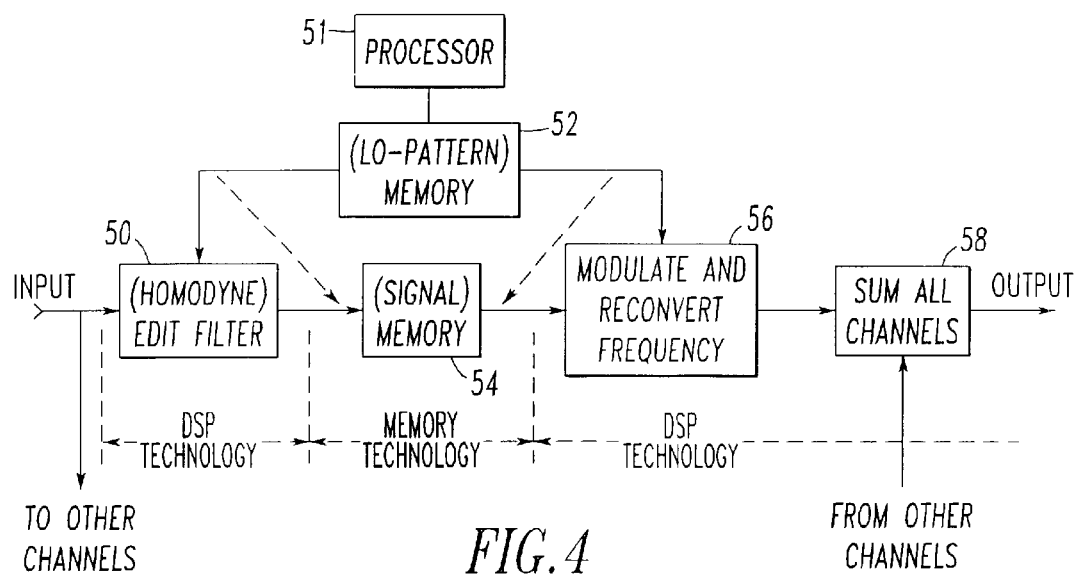
FIG. 4 is a schematic of a memory of the present invention to be used with the digital filter of the present invention and is often referred to as a digital radio frequency memory (DRFM).

An example in which the EDIT filter of the present invention is integrated into a basic memory for use in a variety of applications is shown in FIG. 4. This is part of a system that is often called a "DRFM." An input signal is delivered to an EDIT filter 50 of the present invention and also to other channels containing similar structure. The EDIT filter 50 is also supplied with the requisite LO pattern from an LO pattern memory 52. The bus providing the LO pattern memory 52 with the generated LO pattern from a processor 51 is passed in non-real time and only when the filter or modulation needs to be reprogrammed.

The filtered signal is supplied to a signal memory 54, which serves to delay the filtered signal. The filtered signal is supplied to a modulator and upconverter unit 56. This unit 56 also is supplied with the pattern defining the modulation and frequency upconversion from the LO pattern memory 52. The unit 56 then outputs a filtered delayed modulated signal either to an output, or if there is more than one channel, to a channel adder 58 which sums all of the filtered delayed modulated signals from the channels which is then output.

While the EDIT filter 50 requires an LO pattern memory 52 to allow real time continuous operation, the memory requirements of the LO pattern memory 52 are very small compared with the size of the signal memory 54. Thus, the provision of the LO pattern memory 52 will negligibly affect the cost of the overall system.

The LO pattern may be generated as indicated above. The software required for generating the LO pattern is no more complex than that required for computing weights for each tap in a conventional FIR filter. Further, once the LO pattern is generated, it will not need to be altered until the filter is changed. Thus, only a single multiplication will be required in the EDIT filter 50. The EDIT filter thereby provides continuous real-time filtering functionality using negligible cost, discontinuous, non-real-time software operations.

The EDIT filter of the present invention has numerous applications, including radio, television, communication, radar and electronic warfare. The design of many of these systems is unsettled because of the transition to the use of clocked sampling/replication and digital signal processing technology. The sampling/replication is done with high clock rate, high resolution analog to digital converters and digital to analog converters. However, these analog components will soon be displaced by digital components. The EDIT filter is intended for use with these digital systems.

Another development is that of a channelized architecture. Channelization is the partitioning of broad frequency bands into channels so that each channel can be sensed or modulated independently of one another. Channelization is accomplished with digital filters, but cost has been a major impediment to pervasive implementation. Since channelization involves on the order of hundreds of filters, the reduction of cost of these filters provided by the EDIT filter of the present invention is particularly advantageous, as shown in FIG. 4.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An efficient digital integration technique filter comprising:
    a source of a local oscillator pattern for providing a desired weighting of an input signal;
    a multiplier receiving said input signal and said local oscillator pattern and outputting a product waveform; and
    a summing circuit receiving said product waveform and outputting a filtered signal,
    whereby continuous real-time filtering using discontinuous non-real time software operations is provided.

2. The digital filter as recited in claim 1, wherein said summing circuit includes a delay line and two adders for providing a running total of said product waveform.

3. The digital filter as recited in claim 1, wherein said summing circuit includes a tapped delay line and an associated number of adders for providing a running total of said product waveform.

4. The digital filter as recited in claim 1, wherein said summing circuit includes two adders and a multiplier between a feedback loop of said two adders.

5. The digital filter as recited in claim 4, wherein said multiplier is implemented with less than two gates for each of the two adders.

6. The digital filter as recited in claim 1, wherein the local oscillator pattern source includes a memory for storing the local oscillator pattern.

7. The digital filter as recited in claim 1, wherein the local oscillator pattern is computed by an summing of waveforms.

8. The apparatus as defined in claim 1 and additionally including:
    a modulator and upconverter unit receiving a pattern from the source of a local oscillator pattern for defining a requisite modulation and frequency upconversion characteristic and modulating and upconverting the filtered signal output from said digital filter.

9. The apparatus as defined in claim 8 and additionally including a local oscillator pattern memory and filtered signal memory.

10. An apparatus for digitally filtering and modulating a digitally filtered signal with a local oscillator pattern, comprising:
    a digital integration filter including,
    a source of a local oscillator pattern for providing a desired weighting of an input signal;
    a multiplier receiving said input signal and said local oscillator pattern and outputting a product waveform,
    a summing circuit receiving said product waveform and outputting a filtered signal,
    whereby continuous real-time filtering using discontinuous non-real time software operations is provided; and
    a modulator and upconverter unit receiving a pattern from said source of a local oscillator pattern for defining a requisite modulation and frequency upconversion characteristic and modulating and upconverting the filtered signal output from said digital filter.

11. The apparatus as recited in claim 10 and including a plurality of channels, each channel including a respective digital integration filter and modulator and upconverter unit.

12. The apparatus as recited in claim 11, further comprising a channel adder receiving modulated filtered signals from said plurality of channels and outputting a sum of the modulated filtered signals.

13. The apparatus as recited in claim 10, further comprising a pattern memory for storing the local oscillator pattern.

14. The apparatus as recited in claim 10, further comprising a processor for generating the local oscillator pattern.

15. The apparatus as recited in claim 14, wherein said processor adds a number of patterns to determine the local oscillator pattern.

16. The apparatus as recited in claim 14, wherein said processor discontinuously delivers the local oscillator pattern to a pattern memory for storing the local oscillator pattern and for supplying the local oscillator pattern to the digital filter and the modulator and upconverter unit.

17. The apparatus as recited in claim 16 and including a signal memory between the digital filter and modulator and upconverter unit.

18. The apparatus as recited in claim 10 and additionally including a memory located between the digital integration filter and the modulator and upconverter unit for delaying the filtered signal output from said digital filter.

19. A method of digitally filtering an input signal, comprising the steps of:
    generating an oscillator pattern for providing a desired weighting of an input signal;
    multiplying the input signal with a local oscillator pattern and outputting a product waveform; and
    summing said product waveform,
    whereby continuous real-time filtering using discontinuous non-real time software operations is provided.

20. The method as recited in claim 19, wherein said summing includes providing a running total of said product waveform.

21. The method as recited in claim 19, wherein said summing includes providing a feedback loop.

22. The method as recited in claim 19, further comprising, before the multiplying, storing the local oscillator pattern.

23. The method as recited in claim 22, further comprising discontinuously supplying the local oscillator pattern in the storing step.

24. The method as recited in claim 19, further comprising, before the multiplying, computing the local oscillator pattern by a summing of sinusoids.

25. A digital RF memory, comprising:
    a processor for generating a local oscillator pattern, said pattern defining a desired weighting of an input signal and a requisite modulation and frequency upconversion characteristic;
    a pattern memory for storing the local oscillator pattern,
    a digital integration filter including, a multiplier receiving said input signal and said local oscillator pattern and outputting a product waveform, and a summing circuit receiving said product waveform and generating a filtered output signal;
    a signal memory for storing the filtered output signal whereby continuous real-time filtering using discontinuous non-real time software operations is provided;
    a modulator and upconverter unit receiving the local oscillator pattern and modulating and upconverting the filtered output signal; and
    further including a plurality of channels, each channel including a respective digital integration filter, signal memory, and modulator and upconverter unit;

a channel adder receiving the modulated filtered output signals from said plurality of channels and outputting a sum of the modulated filtered output signals, and wherein said processor discontinuously delivers the local oscillator pattern to the pattern memory for storing the local oscillator pattern and for supplying the local oscillator pattern to the digital filter and the modulator and upconverter unit.

\* \* \* \* \*